(12) United States Patent
Filoramo et al.

(10) Patent No.: US 6,433,647 B1
(45) Date of Patent: Aug. 13, 2002

(54) LOW NOISE I-Q MIXER

(75) Inventors: Pietro Filoramo, Siracusa; Giuseppe Palmisano, Catania; Raffaele Salerno, Siracusa, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/429,700

(22) Filed: Oct. 28, 1999

(30) Foreign Application Priority Data

Oct. 30, 1998 (EP) .............................. 98830657

(51) Int. Cl.[7] .............................. H04B 1/28
(52) U.S. Cl. .................. 332/103; 332/103; 332/105; 327/357; 455/118; 455/323; 455/326
(58) Field of Search .................. 332/103, 105; 455/118, 323, 326; 327/357

(56) References Cited

U.S. PATENT DOCUMENTS 4,931,746 A  6/1990  Tränkle et al. .............. 330/254
5,448,772 A  9/1995  Grandfield .................. 455/333
6,054,889 A * 4/2000  Kobayashi .................. 327/357

FOREIGN PATENT DOCUMENTS

EP    0779704 A1   6/1997
GB    2177860 A    1/1987

OTHER PUBLICATIONS

McDonald, "TP9.4: A 2.5GHz BiCMOS Image–Reject Front–End," *IEEE International Solid–State Circuits Conference*, pp. 144–145, 1993.

* cited by examiner

*Primary Examiner*—Arnold Kinkead
(74) *Attorney, Agent, or Firm*—Lisa K. Jorgenson; E. Russell Tarleton; SEED IP Law Group PLLC

(57) ABSTRACT

A low-noise quadrature phase I-Q modulator having a pair of Gilbert cell input stages driven by a feed voltage line and receiving in input respective square wave command signals coming from a local oscillator. The modulator comprises a transistor block with transistors connected to each cell and destined to carry out a voltage-current conversion of a signal in radio frequency received from the block itself; such block further including a single degeneration resistance.

24 Claims, 3 Drawing Sheets

Figure 1: (PRIOR ART)

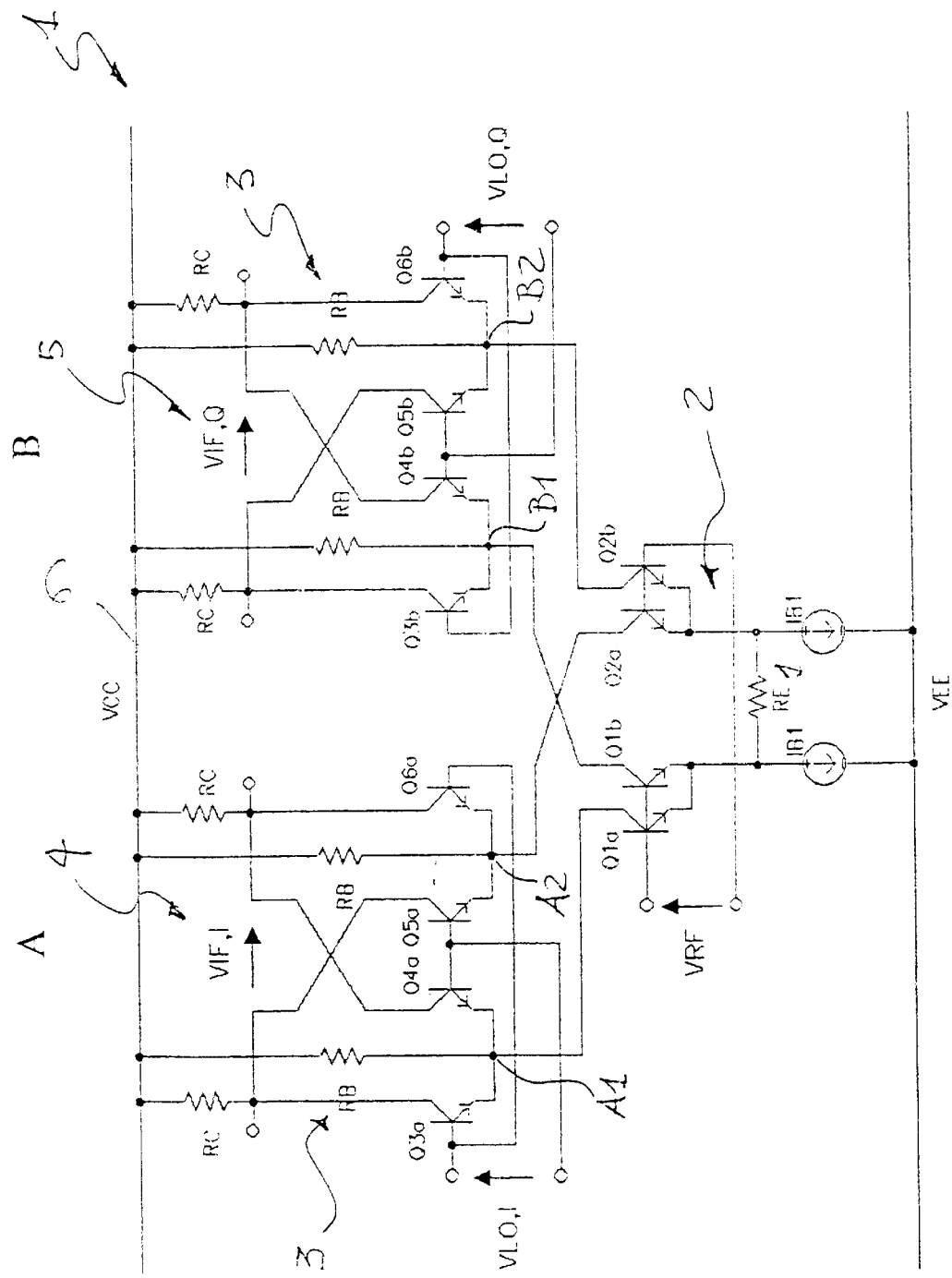
Figura 3

LOW NOISE I-Q MIXER

TECHNICAL FIELD

The present invention relates to a low noise I-Q phase-quadrature modulator. More particularly, the invention relates to a low noise I-Q phase-quadrature for applications in radio frequency signal receivers, of the type comprising a plurality of Gilbert cell input stages driven by a voltage feed line receiving respective square wave command signals in input from a local oscillator.

BACKGROUND OF THE INVENTION

As is well known, in recent years there has been notable progress and changes in the world of telecommunications. In particular, the development of new integrated electronic devices on semiconductors has contributed to a large number of these changes.

Amongst these improvements is the reduction of power consumption in portable electronic equipment. This reduction of energy consumption has permitted a reduction in weight and dimensions of this portable equipment, lengthening at the same time their useful life.

All this has resulted in a large decrease in costs, something which has made this type of portable electronic equipment accessible to a large part of the population as for example mobile cellular telephones or portable computers.

The effort to reduce the size of electronic circuitry is continuing. For example, various studies are under way at present for a new type of a radio frequency receiver RF that could be very compact.

At the moment, many designers are working on receivers based on an architecture that includes a rejection-type image mixer to permit the reduction of the stringent specifications of a band-pass filter RF, downstream, therefore making it possible to have a significant decrease in the relative costs.

An architecture of rejection-type mixer of the image band of the known type has been proposed by Hatley and is represented in FIG. 1. This architecture allows the conversion to the frequency RF of a desired band, Sw(f) of the RF signal, suppressing the image band, Su(f).

A signal 20 coming from a source LO of a local oscillator is applied to a network 21 of quadrature producing two signals 22, 23 out of phase shifted the one to the other by 90°. Such signals are applied to an I-Q modulator 24. The modulator 24 produces two output signals 25, 26 which are further out of phase in order to be applied to the input of a combiner node 27 obtaining useful signals in phase and image signals in counter-phase. In the absence of errors between the two distinct signal pathways, the image signal of the band IS at intermediate frequency is totally eliminated.

In a real mixer, nevertheless, the presence of module and phase errors in gains of the two signal pathways determines an incomplete suppression of the image at intermediate frequency. For example, the rejection requisite of image of 30 dBc requires at the same time a phase error which is less than 3° and an amplitude error which is less than 0.3 dB (3.5%).

SUMMARY OF THE INVENTION

An embodiment of the present invention includes a current I-Q modulator having structural and functional characteristics that would allow the use of an image rejection-type mixer with a very low level of introduction of noise.

The modulator can operate in reception as if there was a "fusion" of the input stages formed by the Gilbert cells, therefore reducing at the same time the polarization noise of each input stage.

The characteristics and the advantages of a modulator according to the invention will become clear from the description hereinbelow, of an example of embodiment reported as indication and not limitation thereto of the invention, which makes reference to the attached drawings.

BRIEF DESCRIPTION OF THE DRAWINGS

FIG. 3 shows a schematic view of an I-Q modulator according to the present invention.

DETAILED DESCRIPTION OF THE INVENTION

Figure 1:
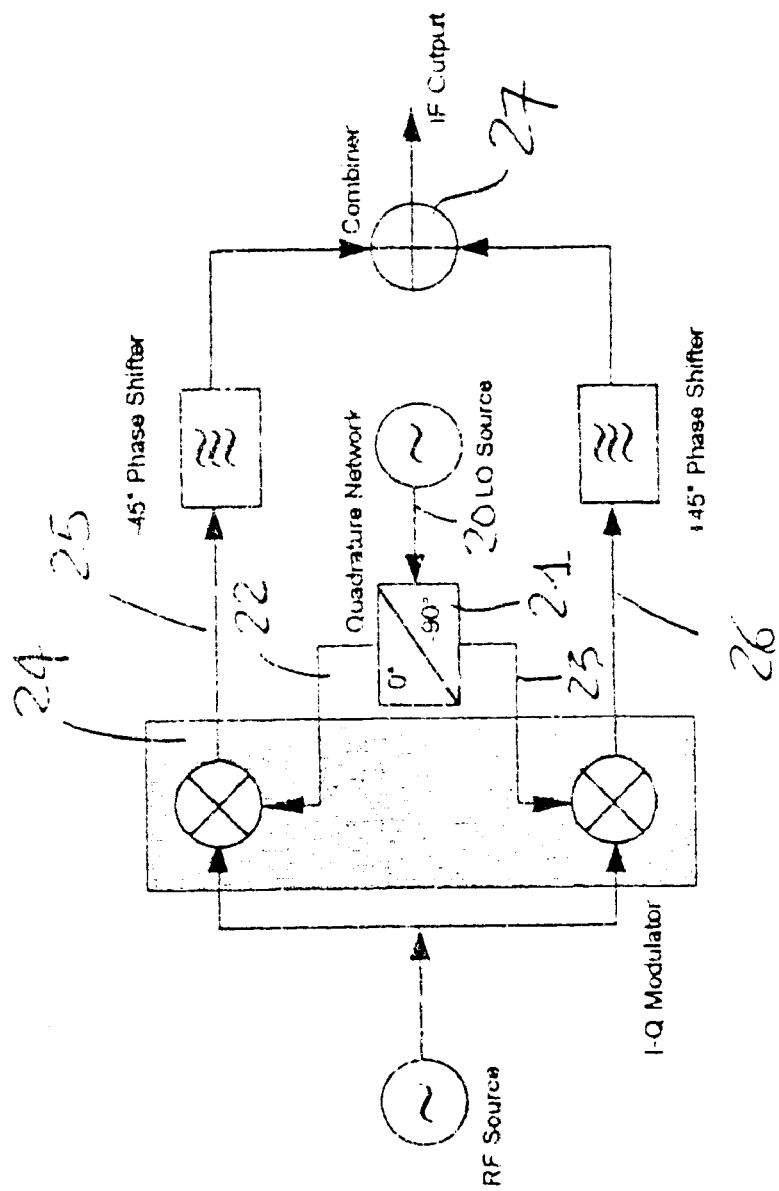
FIG. 1 shows a schematic view of an I-Q modulator realized according to the prior art.

With reference to such figure, and in particular to the example in FIG. 3, a low-noise modulator 1 is wholly and schematically indicated, which is realized according to the present invention.

The phase-quadrature modulator 1 according to the invention structurally presents a mirrored symmetry which is highlighted by the letters A and B, which respectively indicate circuit stages relative to signals in phase, indexed I, and in quadrature, indexed Q.

The structure of the modulator 1 can, though, be considered also from another point of view, and in particular as a circuit device essentially comprising two functional blocks 2, 3. The first block 2 is destined to carry out a voltage-current conversion, while the other block 3 is destined to carry out a frequency conversion.

The voltage-current conversion block 2 comprises a double couple of transistor Q1a, Q2a and Q1b, Q2b; a resistance RE1 of degeneration and a pair of current generators $I_{B1}$.

The transistor Q1a, Q2a and Q1b, Q2b are all of the NMOS type, even if there is nothing preventing the realization of a dual circuit incorporating PMOS transistors. The transistor Q1a and Q1b have respective source terminals. Amongst such source terminals and a reference voltage Vee there is one of the current generators $I_{B1}$.

The transistors Q2a and Q2b also have respective gate terminals in common, as they also have respective source terminals. Between such source terminals and the Vee voltage reference is the other current generator $I_{B1}$.

The resistance RE1 of degeneration is connected to the source terminals of transistor Q1a, Q1b and Q2a, Q2b.

Block 3, which carries out the frequency conversion, comprises a pair of Gilbert cells 4 and 5.

The Gilbert cells are essentially differential cells with a particular structure, but are of known type. For example, Gilbert cells similar to those of the modulator to according to the invention are also incorporated in the known type of modulator illustrated in FIG. 2.

The first cell 4 comprises the transistors from Q3a and Q6a to Q6b. Each cell 4, 5 receives in input a respective square wave signal $V_{LO,I}$; $V_{LO,Q}$ produced by a local oscillator LO, as the one shown in FIG. 1.

Cells 4 and 5 are fed by a line 6 of Vcc feed voltage. Furthermore, charge resistances Rc are foreseen between the line 6 and each branch of the cells 4, 5 in order to correctly polarize the transistors incorporated in the cells themselves. The first cell 4 comprises two circuit nodes A1, A2 connected to the voltage-current conversion block 2. The first node A1 is connected to the drain of the transistor Q1a, while the second node A2 is connected to the terminal of drain of the transistor Q2a. The second cell 5 comprises two circuit nodes B1, B2 connected to the voltage-current conversion block 2. The first node B1 of the second cell is connected to the drain of the transistor Q1b, while the second node B2 is connected to the drain terminal of the transistor Q2b. Advantageously, according to the invention, the modulator 1 also comprises a plurality of sink resistors. In particular a resistance $R_B$ is foreseen between each of the nodes A1, A2, B1, B2 and the Vcc feed voltage reference.

Figure 2:
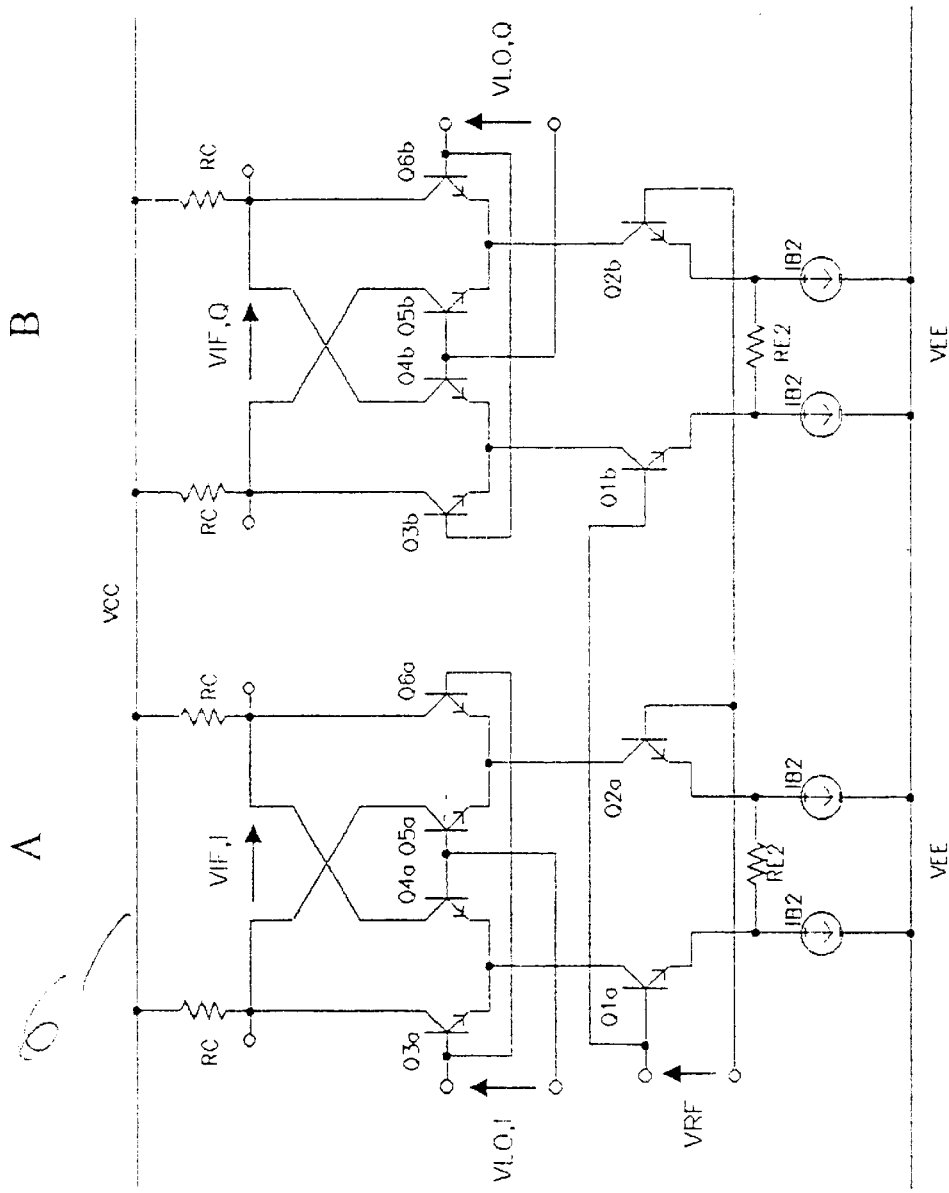
FIG. 2 shows a schematic view in circuit detail of the modulator of FIG. 1.

For ease of illustration the operation of a modulator according to the invention will be now described, although only making reference to section A, as sections A and B are identical. A voltage radio frequency signal VRF is converted into current by the voltage-current converter 2 comprising the transistors Q1a, Q2a and of the resistance RE1. The current so generated concerns the Gilbert cell 4 comprising the transistors Q3a–Q6a which invert or not the phase of the signal according to the command in voltage $V_{LO,I}$ received from the local oscillator. The signal of out-going current from cell 4 is therefore converted into a voltage signal via the charge resistances Rc. The operation which results is an analogic multiplication of the radio frequency signals $V_{RF}$ for the square wave signal $V_{LO,I}$. The resulting signal $V_{IF,1}$ is formed by various harmonic components and is generally filtered in order to extract the intermediate frequency component desired, which is the difference of the fundamental frequencies of the signals $V_{RF}$ and $V_{LO,I}$. The resistances of the sinks $R_B$ allows, as will be explained later, the reduction of the polarization current of the cell 4 with the objective of decreasing the noise it generates. In order to highlight the advantages of the proposed solution it is useful to compare it to that of a traditional I-Q modulator with separate voltage-current converters, as illustrated in FIG. 3. For this reason it is convenient to carry out this comparison on equal power dissipation, that is requiring the current generators $I_{B1}=2\ I_{B2}$. In such conditions, the relations of respective conversion gains for the circuits presented in FIGS. 2 and 3 are respectively:

$$G_1 \equiv \frac{V_{IF}}{V_{RF}} = \frac{2R_c}{\pi R_{E1}} \frac{g_m R_{E1}}{1+g_m R_{E1}} \quad (1)$$

$$G_2 \equiv \frac{V_{IF}}{V_{RF}} = \frac{2R_c}{\pi R_{E2}} \frac{g_m R_{E2}}{1+\frac{g_m R_{E2}}{2}} \quad (2)$$

Each of the relations (1) and (2) shows a term, dependent on transconductance $g_m$, which takes into account a not ideal transferal of the voltage-current converter. The requirement of linearity of the circuit depends upon such term. In fact, in conditions of ample signal, the transconductance $g_m$ varies considerably because of the strong variation of the current in the transistors, thus generating a dependence of the conversion gain from the amplitude of the signal itself.

As can be inferred by the expressions (1) and (2), with the condition $R_{E1}=(½)R_{E2}$ the two modulators show the same requirement of linearity and the same conversion gain.

Therefore, at equal dissipation of power and with a degeneration resistance $R_{E1}=(½)R_{E2}$ the modulator proposed by the disclosed embodiment of the present invention has the same linearity and the same gain of voltage as the traditional one.

The disclosed embodiment is more advantageous with respect to existing designs in terms of less noise. From this point of view, with the idea of comparing the two solutions, the mathematical relations for the equivalent resistance of input noise of the circuits represented in FIGS. 3 and 2 are respectively shown hereinbelow:

$$R_{EQ1} = R_{E1} + 2r_b + \frac{1}{g_m} + \frac{R_{E1}^2 \pi^2}{2R_C} + 2\frac{R_{E1}^2}{R_B} + \quad (3)$$
$$\frac{g_m R_s^2}{2\beta} + \gamma\left(r_{bq} + \frac{1}{2g_{mq1}} + \frac{g_{mq1} R_{sq}^2}{8}\right)\left(g_{mq1} R_{E1} \frac{\pi}{2}\right)^2$$

$$R_{EQ2} = R_{E2} + 2r_b + \frac{1}{g_m} + \frac{R_{E2}^2 \pi^2}{2R_C} + \quad (4)$$
$$\frac{g_m R_s^2}{2\beta} + \gamma\left(r_{bq} + \frac{1}{2g_{mq2}} + \frac{g_{mq2} R_{sq}^2}{8}\right)\left(g_{mq2} R_{E2} \frac{\pi}{2}\right)^2$$

wherein the following symbols are used:

$r_b$ base resistance of the transistors of the voltage-current converter $g_m$ transconductance of the transistors of the voltage-current converter RS resistance of the command source of the voltage-current converter $\beta$ current gain of the transistors of the voltage-current converter $\gamma$ coefficient dependent on the commutational speed of the phase-quadrature modulator $g_{mq}$ transconductance of the transistors of the phase-quadrature modulator $r_{bq}$ base resistance of the transistors of the phase-quadrature modulator $R_{sq}$ command source resistance of the phase-quadrature modulator.

Comparing the two expressions, and having set $R_{E1}=(½)$ $R_{E2}$ so as to restore the same conditions of linearity, the circuit in FIG. 3 features, with respect to traditional topology, a contribution of noise due to the degeneration resistance of the voltage-current converter ($R_{E1}$) divided by two and a contribution of noise due to the charge resistances (Rc) reduced by a factor ¼. Furthermore, due to the presence of the sink resistance $R_B$, which subtracts polarization current from the Gilbert cell and reduces the value of the transconductance $G_{mc}$, the contribution of noise due to cell 4 is less than that of the circuit in FIG. 2.

Clearly, the sink resistance $R_B$ itself generates a noise contribution which, in any case, given the values of RB commonly used (with $R_B>>R_{E1}$) is negligible.

In order to better understand the advantages of the solution according to the invention, it might be useful to find out the numeric values obtained with the expressions (3) and (4) for a typical circuit.

Having set: $I_{B1}=3$ mA; $R_B=30\Omega$; $R_{E1}=50\Omega$; $R_B=4$ KΩ; Rc 500Ω; $R_S=100\Omega$; $R_{sq}=30\Omega$; $\beta=70$ and $\gamma=0$, from the expressions (3) and (4) is obtained:

$R_{EQ1}=376\Omega$ and $R_{EQ1}=2,4$ KΩ

Or equivalently in terms of noise figure:

$F_1=6,8$ dB and $F_2=14$ dB.

Therefore, at equal dissipation and linearity, the modulator disclosed herein introduces a notably lower noise level than existing circuits.

The disclosed embodiment of the present invention finds a use in applications in which a low noise level is necessary, such as, for example, receivers with a passive antenna and, in general, receivers with particularly stringent noise specifications. The disclosed embodiment has the advantage of introducing, at work conditions being equal, a notably lower noise level with respect to that introduced by commonly used circuit solutions.

What is claimed is:

1. A low noise phase quadrature I-Q modulator, comprising a pair of Gilbert cell input stages fed by a feed voltage line and receiving in input, respectively, first and second square wave command signals from a local oscillator, a transistor block comprising NMOS-type transistors connected to each cell and configured to carry out a voltage-current conversion of a radio frequency signal received by the transistor block, said transistor block comprising a single degeneration resistance.

2. The modulator of claim 1 wherein said block comprises a double pair of transitors, said degeneration resistance, and a pair of current generators.

3. The modulator of claim 1 wherein the transistors of a first pair have respective gate terminals and source terminals in common, and between each of the source terminals and a reference voltage there is a current generator.

4. The modulator of claim 2 wherein the transistors of a second pair have respective gate terminals and source terminals in common, and that between each of the source terminals and a reference voltage there is a current generator.

5. The modulator of claim 1 wherein the degeneration resistance is connected between the source terminals of a first and second pair of transistors.

6. The modulator of claim 1 wherein each cell comprises two nodes coupled to the transistor block of voltage-current conversion, comprising a first node connected to a conduction terminal of a first transistor and a second node connected to the conduction terminal of a second transistor.

7. The modulator of claim 6, comprising a sink resistance between each one of said first and second nodes and the feed voltage line.

8. The modulator of claim 7 wherein said sink resistance has a higher value that said degeneration resistance.

9. A low noise phase quadrature I-Q modulator, comprising:
first and second input stages coupled to a first voltage source, each input stage having first and second nodes and an input coupled to a respective signal source;
a voltage-current converter coupled to a second voltage source and to a voltage radio frequency source, the voltage-current converter having first and second terminals coupled respectively to the first nodes of the first and second input stages, and third and fourth terminals coupled respectively to the second nodes of the first and second input stages; and
a sink resistance coupled between the first voltage source and each of the first and second nodes of the first and second input stages and configured to reduce polarization of the input stages and reduce the generation of noise.

10. The modulator of claim 9 wherein the sink resistance comprises four resistors, each resistor having a first terminal coupled to the first voltage source and a second terminal coupled respectively to the first and second nodes of the first and second input stages.

11. The modulator of claim 9, further comprising a current source coupled between the voltage-current converter and the second voltage source.

12. The modulator of claim 11 wherein the voltage-current converter has first and second current terminals, and the current source comprises first and second current sources respectively coupled between the first and second current terminals of the voltage-current converter and the second voltage source.

13. The modulator of claim 12, further comprising a degeneration resistor coupled between the first and second current terminals of the voltage-current converter.

14. The modulator of claim 13 wherein the sink resistors each have a resistance greater than the resistance of the degeneration resistor to further reduce noise generated by the sink resistor.

15. A method of reducing noise in a phase quadrature I-Q modulator, comprising:
receiving a voltage radio frequency signal in a voltage-current converter;
converting the voltage radio frequency signal in the voltage-current converter to a current signal;
receiving a control signal and the current signal in an input stage;
reducing polarization of the current signal in the input stage to a reduced-noise current signal; and
converting the reduced-noise current signal to a reduced-noise voltage signal.

16. The method of claim 15 wherein receiving the control signal and the current signal comprises receiving a control signal and the current signal in a first Gilbert cell and an inverted control signal and the current signal in a second Gilbert cell and inverting the phase of the current signal in one of the first and second Gilbert cells in response to the control signal.

17. The method of claim 16 wherein reducing the polarization comprising reducing polarization of the current signal through one or more sink resistors in the first and second Gilbert cells.

18. The method of claim 17 wherein converting the voltage radio frequency signal comprises maintaining linearity of the current signal through a degeneration resistor coupled between first and second terminals on the voltage-current converter.

19. The method of claim 18 further comprising reducing noise generated in the one or more sink resistors by configuring the sink resistors to have a greater resistance than the resistance of the degeneration resistor.

20. A low noise phase quadrature I-Q modulator, comprising a pair of Gilbert cell input stages fed by a feed voltage line and receiving in input respective square wave command signals from a local oscillator, a transistor block connected to each cell and configured to carry out a voltage-current conversion of a radio frequency signal received by the block, the block comprising a single degeneration resistance that is connected between source terminals of a first and a second pair of transistors in said block.

21. A low noise phase quadrature I-Q modulator, comprising a pair of Gilbert cell input stages fed by a feed voltage line and receiving in input respective square wave command signals from a local oscillator, a transistor block connected to each cell and configured to carry out a voltage-current conversion of a radio frequency signal received by the block, the block comprising a single degeneration resistance, each cell comprising two nodes coupled to the transistor block of voltage-current conversion comprising a first node connected to a conduction terminal of a first transistor and a second node connected to the conduction terminal of a second transistor, and further comprising a sink resistance coupled between each one of said first and second nodes and the feed voltage line.

22. The modulator of claim 21 wherein the sink resistance has a higher value than the degeneration resistance.

23. A low noise phase quadrature I-Q modulator, comprising a pair of Gilbert cell input stages by a feed voltage line and receiving an input, respectively, first and second square wave command signals from a local oscillator, and a transistor block connected to each cell and configured to carry out a voltage-current conversion of a radio frequency signal received by the transistor block, the transistor block comprising a single degeneration resistance, and each cell comprising two nodes coupled to the transistor block, including a first node connected to a conduction terminal of a first transistor and a second node connected to the conduction terminal of a second transistor, and each cell further comprising a sink resistance coupled between each one of the first and second nodes and the feed voltage line.

24. A low noise phase quadrature I-Q modulator, comprising a pair of Gilbert cell input stages by a feed voltage line and receiving an input, respectively, first and second square wave command signals from a local oscillator, and a transistor block connected to each cell and configured to carry out a voltage-current conversion of a radio frequency signal received by the transistor block, the transistor block comprising a single degeneration resistance, and each cell comprising two nodes coupled to the transistor block, including a first node connected to a conduction terminal of a first transistor and a second node connected to the conduction terminal of a second transistor, and each cell further comprising a sink resistance coupled between each one of the first and second nodes and the feed voltage line, the sink resistance configured to have a higher value than the degeneration resistance.

* * * * *

UNITED STATES PATENT AND TRADEMARK OFFICE
CERTIFICATE OF CORRECTION

PATENT NO. : 6,433,647 B1
DATED : August 13, 2002
INVENTOR(S) : Pietro Filoramo et al.

It is certified that error appears in the above-identified patent and that said Letters Patent is hereby corrected as shown below:

<u>Column 5,</u>
Line 22, "The modulator of claim 1" should read as -- The modulator of claim 2 --.

Signed and Sealed this

Tenth Day of December, 2002

JAMES E. ROGAN
*Director of the United States Patent and Trademark Office*